(12) United States Patent
Van Buren et al.

(10) Patent No.: US 7,221,967 B2
(45) Date of Patent: May 22, 2007

(54) ENHANCED GAIN SELECTED CELL PHONE BOOSTER SYSTEM

(75) Inventors: Alan Van Buren, Cedar City, UT (US); Patrick L. Cook, St. George, UT (US)

(73) Assignee: Wilson Electronics, Inc., Saint George, UT (US)

( * ) Notice: Subject to any disclaimer, the term of this patent is extended or adjusted under 35 U.S.C. 154(b) by 172 days.

(21) Appl. No.: 11/040,626

(22) Filed: Jan. 22, 2005

(65) Prior Publication Data

US 2006/0058072 A1    Mar. 16, 2006

Related U.S. Application Data

(63) Continuation-in-part of application No. 10/940,506, filed on Sep. 14, 2004, now abandoned.

(51) Int. Cl.
H04B 1/04      (2006.01)
H04B 1/38      (2006.01)
H04M 1/00      (2006.01)

(52) U.S. Cl. ............... 455/571; 455/127.3; 455/550.1

(58) Field of Classification Search ........... 455/571, 455/127.3, 550.1, 127.1, 73, 123, 126, 129, 455/91; 330/2, 278, 279, 285, 151
See application file for complete search history.

(56) References Cited

U.S. PATENT DOCUMENTS 5,303,395 A * 4/1994 Dayani ................. 455/571
5,351,030 A * 9/1994 Kobayashi et al. ......... 338/295
5,995,813 A * 11/1999 Ishikura et al. .......... 455/127.2
6,175,748 B1 * 1/2001 Aboukhalil et al. ........ 455/571
6,230,031 B1 * 5/2001 Barber ....................... 455/571
6,690,915 B1 * 2/2004 Ito et al. ......................... 455/7
6,697,648 B1 * 2/2004 Kaesser ....................... 455/571
2002/0142801 A1 * 10/2002 Miller et al. ................. 455/557
2003/0100351 A1   5/2003 Friesen et al.
2005/0170867 A1 * 8/2005 Grant Friesen et al. ..... 455/571
2006/0058072 A1 * 3/2006 Buren et al. ................ 455/572

FOREIGN PATENT DOCUMENTS

EP     0 590 888 B1    12/2001

* cited by examiner

Primary Examiner—Sonny Trinh
(74) Attorney, Agent, or Firm—Leon D. Rosen

(57) ABSTRACT

Apparatus for boosting the signal between a cell phone (14) and a cell site (16), which includes an amplifier (64) that continually operates at a fixed gain. A power detector (72) controls an attenuator (62) that can be switched to pass the amplified signal through an attenuator (74) of moderate resistance, or through an attenuator (60) of zero resistance so the power output is boosted within the limits allowed under cell phone system standards.

9 Claims, 2 Drawing Sheets

ENHANCED GAIN SELECTED CELL PHONE BOOSTER SYSTEM

CROSS-REFERENCE

This is a continuation-in-part of U.S. application Ser. No. 10/940,506 filed Sep. 14, 2004 now abandoned.

BACKGROUND OF THE INVENTION

Cell phone systems include base stations, or cell sites that control the output of cell phones. The control is such that if the cell phone is far from the nearest cell site the cell phone is directed to transmit at a high maximum amplitude, and so if the cell phone is close to the cell site the cell phone is directed to transmit at only a much lower maximum amplitude. TIA-98-E standards for the cell phone industry specify that maximum cell phone output cannot exceed +30 dBm (decibels above one milliwatt) even when the cell phone is far from the nearest cell site. Also, when the cell phone is near the cell site, the cell phone output cannot exceed −50 dBm (decibel below one milliwatt). The cell site controls cell phone output to comply with these standards.

Boosters are available to amplify weak signals received from a cell site and to amplify the outputs of cell phones, when the cell site is far and the received signal is weak. Such boosters commonly use a system wherein the amplifier gain is continually variable, so when the received signal is strong the amplification is low and when the received signal is very weak the amplification is high, with the power output to the antenna always kept below the limit set by the cell site. One problem with such boosters is that continuously variable amplification increases non-linear response and results in emissions, adjacent channel interference, intermodulation and desensitization. Such boosters often satisfy unknowlegeable customers, who connect a cell phone through the amplifier and measure how much the signal strength increases (as seen on the cell phone received signal strength indicator). Such unknowlegeable customers do not realize that at low levels, the noise figure of the amplifier is the primary factor that determines sensitivity. Most available boosters transmit excessive power when close to a cell site, which severely disrupts proper cell site operation.

A cell phone booster that provided maximum allowed cell phone transmission power output to a distant cell site, and maximum allowed output when close to a cell site to assure recognition, all while keeping transmitted signals within the limits set at every moment by the cell site, would be of value.

SUMMARY OF THE INVENTION

In accordance with one embodiment of the invention, a cell phone booster is provided, of a type that connects between a cell phone and an auxiliary antenna, which provides amplification of signals received from and transmitted to a cell site. This is accomplished with minimum distortion of signals to avoid breakup of weak signals, and while always transmitting within the power limits set by a cell site at any given time. The booster includes an amplifier which receives signals from the cell phone, attenuates them, and delivers them through an amplifier to the antenna. The amplifier is operated at a constant gain, in the linear range of the amplifier, to avoid distortion. The attenuator device has at least two attenuation levels (one of which can be zero), and a switch arrangement that routes the cell phone output through one of the selected attenuations.

A control that detects the power level of signals allowed by the cell site, controls the switch arrangement to insert the lower level attenuation when the transmit signal strength allowed by the cell site is much greater than the cell phone actual output, which occurs when the cell site is distant. The control inserts the higher attenuation level when the allowed signal strength is only moderately greater than the cell phone actual output, which occurs when the cell site is close. The actual output of the cell phone (which is controlled by the cell site) is used to determine whether the cell site is far or close. The power level of signals allowed by the cell site is an amount that is 7 dB or 3 dB more than the cell phone output.

As a result of tests of a wide variety of cell phones that applicant has made, applicant sets the amplifier to generate a gain of 7 dB and sets the attenuator to pass the signal to be transmitted though zero attenuation when the cell phone output is high. Applicant keeps the amplifier at the same gain of 7 dB but sets the attenuator device to pass the signal to be transmitted through a resistance (that produces an attenuation level) that produces a 4 dB loss for a total 3 dB gain, when the signal level from the cell phone output is low. This results in the signal to be transmitted always being amplified with minimum distortion, and results in transmitted signals that are always substantially within the limits set by the cell site.

A control that controls operation of the switching arrangement that determines what attenuator is connected to the amplifier input, is connected to a power detector. If the power detector detects a high cell phone output (of at least 15 dBm) because the cell site is far away, the combination of amplifier and attenuator device produces a net gain of 7 dB (7 dB from the amplifier, which is not reduced by the attenuator device). That is, the output of the cell phone is amplified by 7 dB before delivery to the antenna. When the power detector detects a low cell phone output (of 7 dBm or less) because the cell site is close, an attenuation of 4 dB is connected and a net gain of 3 dB is produced. When the signal lies between 7 dBm and 15 dBm, the gain is not changed from what existed after the last change. This avoids frequent changing or oscillation between the two levels.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
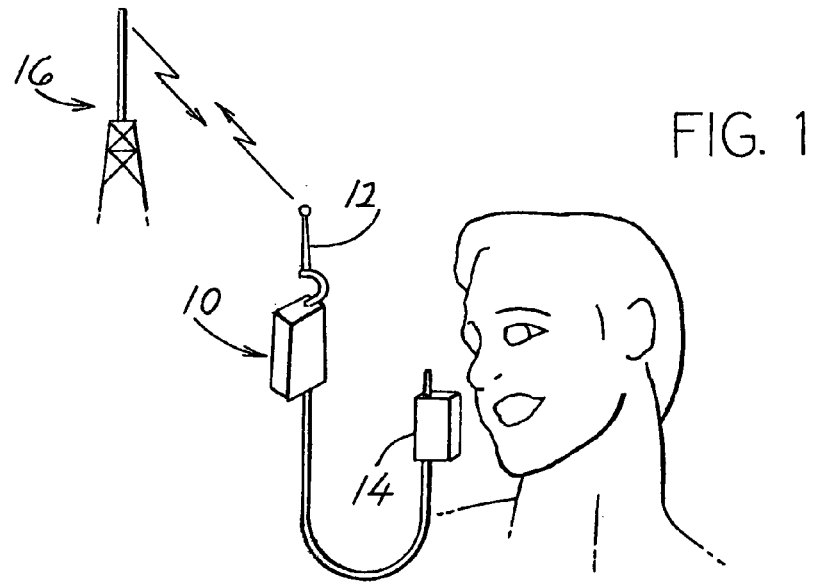
FIG. 1 is an isometric view of a cell phone booster of the present invention, shown installed in a vehicle and connected to a cell phone and to an antenna.

FIG. 1 shows a booster 10 of the present invention, which is connected by coaxial cables to an antenna 12 and to an external antenna connection of a cell phone 14. One particular environment is where the cell phone lies in a vehicle and the antenna lies on the outside of the vehicle or against a glass pane, but the booster can be used in any other circumstance including a fixed installation to boost the capability of the cell phone. When the cell phone initiates a call, it transmits signals of increasing power until the signals are detected by a cell site 16. The cell site then transmits signals (digitally encoded signals) to the cell phone that control the power output of the cell phone. Thus, if the nearest cell site is distant, the cell site will control the cell phone to transmit strong signals, but no more than +30 dBm (30 dB above one milliwatt). If the cell site is close it will control the cell phone to transmit weak signals. For the case of a very close cell site, the cell phone output must not be more than −50 dBm. These limits of +30 dBm and −50 dBm EIRP (Effective Isotropic Radiated Power) are set by the TIA-98-E standard for CDMA (code division multiple access), which is the most widely used standard. These limits are used to assure that the cell site is not overwhelmed by a particular cell phone so the cell site does make the error of not detecting signals from other cell phones. The upper limit varies by category of cell phone and can be as high as about +38 dBm, so a limit of about +30 dBm includes the possibility of +38 dBm.

It is to the advantage of the cell phone user that his/her cell phone transmit at the maximum level allowed by the standard and by the cell phone site that is controlling cell phone output. This increases the possibility that a signal from that particular user's cell phone will be detected and acknowledged by a distant cell site with minimum possibility of signal breakup when connected to the called party, and decreases the possibility that a close cell site will ignore the signal transmitted to it by reason of strong signals from other cell phones.

Applicant has tested a wide variety of cell phones from many manufacturers. Applicant has found that when the tested cell phones were very near a cell site so their transmitted power must be a minimum, that the power output of almost all cell phones ranged from −53 dBm to −55 dBm. This is less than the maximum of −50 dBm allowed by the above-mentioned standards when the cell phone is very close to the cell site. Applicant also found that when the tested cell phones were so far from a cell cite that was in communication with the cell phone, that the signal was almost breaking up, that the power output of almost all cell phones was approximately +23 dBm. This is less that the maximum power of +30 dBm allowed by the above-mentioned standards. Applicant believes that the shortfalls are due to each cell phone manufacturer trying to be sure that all cell phones that it manufactures have outputs within the limits of the TIA-98-E standard despite variations in manufacturing tolerances, and to the manufacturers actually maintaining better tolerances than they allow for. However, few if any, cell phone customers complain about incorrect power.

Applicant increases the usefulness of the cell phone by transmitting the cell phone output closer to the maximum power levels allowed by the above standard. As mentioned above, this minimizes breakup of signals to and from a distant cell site, and maximizes the likelihood of connection to a cell site that is experiencing high traffic and that has not provided sufficient bandwidth to accommodate all paying customers.

Figure 2:
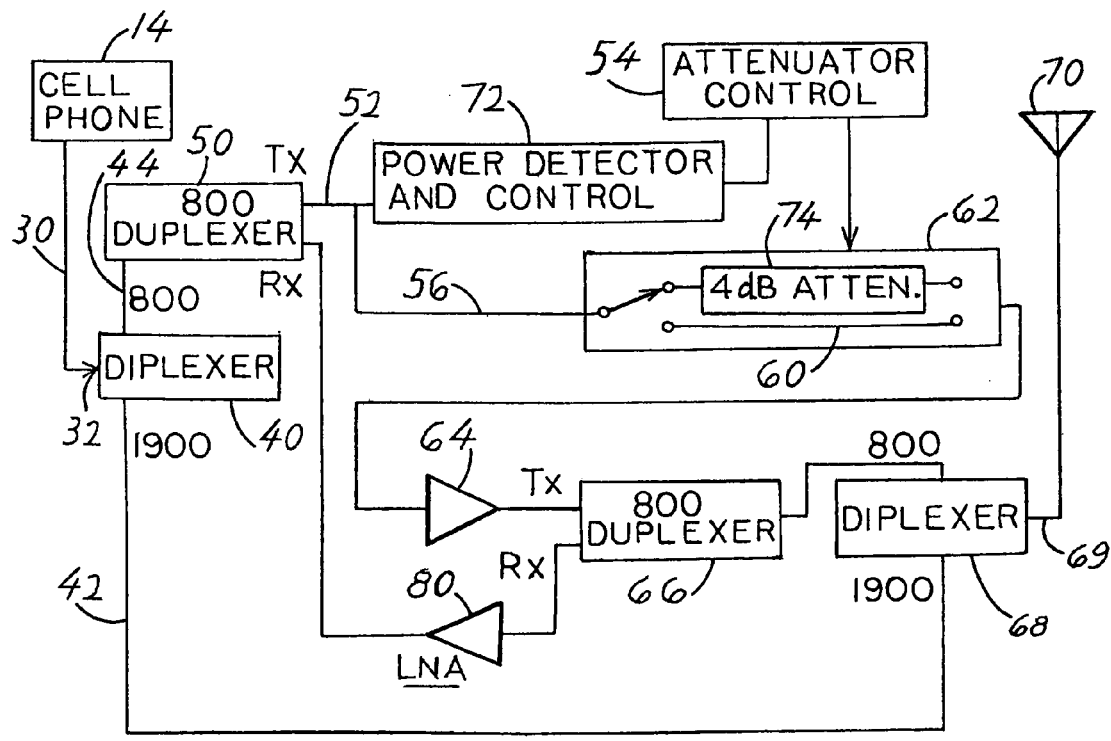
FIG. 2 is a simplified schematic diagram of one embodiment of the booster of FIG. 1

FIG. 2 is a simplified schematic diagram of the circuit in the booster 10 of FIG. 1. Line 30 represents a coaxial cable or other line that connects a booster port 32 to a cell phone 14. The booster is constructed to operate in the 800 MHz band and in the 1900 MHz band. Assuming that the user decides to place a call, the cell phone delivers its output to a diplexer 40 that sends signals in the 1900 MHz band along path 42 and that sends signals in the 800 MHz band along path 44. Assuming the cell phone operates in the 800 MHz band, the cell phone signal passes though a duplexer 50 to its transmit, or TX output 52 (signals received from the cell site pass in the opposite direction through the duplexer 50 into the received, or RX input). The duplexer output 52 passes along path 56 through a zero attenuator 60 of a variable attenuator 62 device, or apparatus, and through an amplifier 64. The signal continues through a second duplexer 66 and second diplexer 68 and through a cable 69 to an antenna 70 which transmits to the cell site.

The output of the cell phone begins at a low level and repeatedly increases until a cell site detects the signal. Thereafter, the cell site transmits signals that control the supposed output of the cell phone (which, in the prior art, has been below the level supposedly set by the cell site). The output of the cell phone 14 is detected by a power detector and control 72 that controls a switching arrangement 54 that, in turn, controls the attenuator device 62. In a system that applicant has designed, the attenuator device 62 has a second attenuator 74 that produces a 4 dB attenuation of signals passing though it. The attenuator 74 is preferably a pi resistor arrangement, although it is possible to use simpler resistive arrangements or capacitive or inductive impedances.

If the power detector 72 detects an initial power level from the cell phone of under 7 dBm, the attenuator 62 is left with the 4 dB attenuator 74 connected between the cell phone and the amplifier 64. As a result of the 7 dB amplification by amplifier 64 but the 4 dB attenuation by attenuator 62, the output signal from the cell phone has been amplified by 3 dB by the time it reaches the antenna 70. If there is a later increase in cell phone output to 15 dBm or more, which is detected by the power detector, the switching arrangement switches to place the zero dB attenuator 60 in series with the cell phone and amplifier 64 (of course the 4 dB attenuator 74 is disconnected). Signals received from the cell site and picked up by antenna 70 pass through diplexer and duplexer 68,66 and pass though a low noise amplifier, or preamplifier 80 which amplifies the signal by 7 dB before passing the signal through duplexer and diplexer 50, 40 to the cell phone.

The actual amplification of amplifier 64 is 7 dB plus cable, connector and circuit losses. The actual amplification of the amplifier is further adjusted for the efficiency of the antenna 70 (as compared to the cell phone antenna). The fixed amplifier gain is always in the linear portion of the amplification range. Since cable, connector and circuit losses vary and amplifier gain level for linear operation varies, an amplifier is chosen that produces a linear gain of more than 7 dB and a resistor (e.g. 102 in FIG. 3) is placed in series with the amplifier to reduce the net gain to 7 dB.

Applicant notes that it often would be desirable to pass both the cell phone output and the output from the antenna though amplifiers that are both connected though the attenuator device 62. However, customers typically judge the benefit of the booster by viewing the signal strength indicator on their cell phone, and a constant high amplification (about 4 dB by amplifier 80) helps in marketing, but does not affect transmitted power.

The switching of the attenuation between attenuators 60, 74 is done along the RF path, instead of by varying the DC input to the amplifier 64. This not only avoids non-linear responses and emissions, but avoids transients, and consequent annoying audio clicks generated by commonly used DC varying devices.

Figure 3:
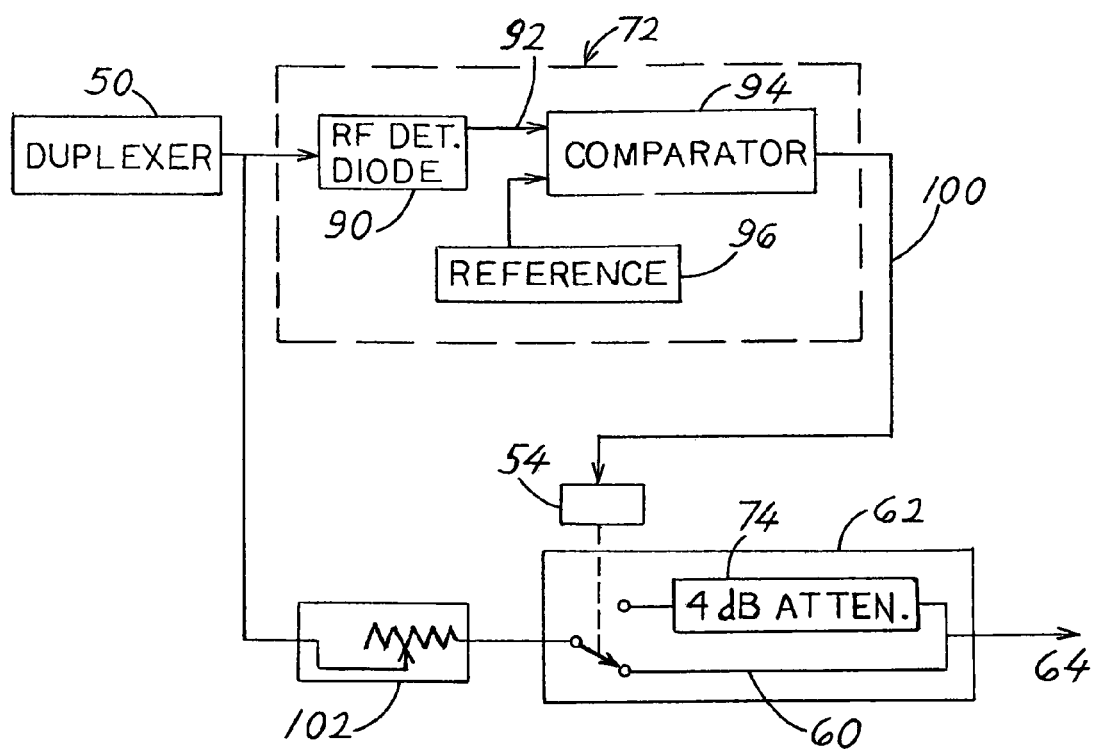
FIG. 3 is a schematic diagram of the power detector and control of the booster of FIG. 2.

FIG. 3 shows that the power detector and control circuit 72 of the booster of FIG. 2 includes a radio frequency diode 90 whose output at 92 is a DC voltage that increases with increasing power output of the cell phone. A comparator circuit 94 compares the voltage at 92 with the voltage of a reference source 96. The comparator 94 has an output 100 that controls operation of the switching assembly 54 that switches one or the other attenuator or attenuations 60, 74 of the attenuator device 62 in series with the amplifier 64. A factory-adjusted tweaking attenuator 102 is adjusted only when minimum gain is needed, to produce the desired amplifier output despite manufacturing tolerances.

Applicant provides a plurality of descrete attenuations by attenuators 60, 74. There would be no reason to provide more than ten descrete attenuation levels. It is possible to provide a plurality of different attenuation levels with a single device such as a PIN diode that can be changed to fix a selected attenuation level, and which is the equivalent of a plurality of resistors or other attenuators.

Thus, the invention provides a booster that improves operation of a cell phone by amplifying the output of the cell phone that is to be transmitted, and by amplifying the output of an antenna that is delivered to the cell phone. The output of the cell phone is amplified to levels close to the maximum levels allowed by industry standards. This is accomplished by use of an amplifier that operates at a constant gain so that it always operates in its linear range, and by the use of an attenuator device that produces a plurality of discrete attenuations, or impedances that are each preferably formed by resistances, and that can be selectively switched into series with the cell phone output that is to be transmitted. As a result of applicant's measurement of cell phones currently sold and the allowed maximum power allowed to be transmitted by cell phones under the extremes of conditions (weakest and strongest signals) applicant has chosen the amplification of the constant output linear amplifier so the minimum needed attenuation is zero. This minimizes current consumption when the cell site is distant. Applicant uses resistances that attenuate the amplifier output to produce gains of about 7 dB (6.25 to 7.75 dB, for the strongest cell phone output to a distant cell site) and about 3 dB (2.25 to 3.75 dB, for the weakest cell phone output to a close cell site). The switching assembly is controlled so switching from a first gain level to a second one, and switching back to the first one occurs only when the maximum or minimum level is exceeded by a plurality of decibels. Thus, for example, switching from 3 dB to 7 dB gain occurs only when a level of 15 dBm (or more) is detected by the power detector, and the booster is switched back to a 3 dB gain only when a level of 7 dBm (or less) is detected by the power detector.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A cell phone booster which is constructed to connect to a cell phone and to an antenna and which can boost a cell phone output signal that is generated by the cell phone for transmission by the antenna, wherein the booster includes a control that detects the strength of the cell phone output signal and that selects a level of amplification of the cell phone output signal that is delivered to the antenna, comprising:
   an amplifier which has an input coupled to said cell phone output, and which has an amplifier output, said amplifier having a constant gain which is in a linear region of the amplifier;
   an attenuator apparatus which is connected in series with said amplifier and which is switchable between at least first and second discrete attenuation levels;
   a switch arrangement controlled by said control which selects one of said attenuation levels of said attenuator apparatus in response to the strength of said cell phone output signal.

2. The booster described in claim 1 wherein:
   said amplifier includes a tweaking resistance that is only manually adjustable at a factory but not during use of the booster.

3. The booster described in claim 1, wherein:
   said attenuator apparatus includes first and second resistances which create said first and second attenuation levels, said resistances each has first and second opposite ends, and said switch arrangement includes at least a first switch that is switchable between first ends of said first and second resistances.

4. A method for operating a cell phone booster which connects to a cell phone and to an antenna and which boosts the cell phone output signal from the cell phone and delivers the boosted signal to the antenna, comprising:
   detecting the strength of the cell phone output signal from the cell phone and using the detected strength to control the amplification of said cell phone output signal from said cell phone booster;
   operating an amplifier at a constant gain level;
   passing said cell phone output signal through said amplifier and through a changeable attenuator device that attenuates the signal passing through by an amount dependent on the detected strength of the cell phone output, and passing the signal that has passed through said amplifier and attenuator device to said antenna.

5. The method described in claim 4 wherein:
   said step of passing the cell phone output signal through a changeable attenuator device includes switching the attenuator device to pass the cell phone output signal through a selected one of a plurality of discrete attenuations.

6. The method described in claim 4 wherein operation of said cell phone requires that the booster output not exceed a maximum power level in any case, and not exceed a minimum power level when the booster must transmit at minimum power, and wherein:
   said amplifier has a fixed gain, and including switching selectable amounts of attenuation to maintain the booster output within the limits required by standards of the cellular industry.

7. A cell phone booster which is constructed to connect to a cell phone and to an antenna and which can boost a cell phone output signal that is generated by the cell phone for transmission by the antenna, wherein the booster includes a control that detects the strength of the cell phone output signal and that selects a level of amplification of the cell phone output signal that is delivered to the antenna, comprising:
   an amplifier apparatus which includes an amplifier with a constant gain, said amplifier apparatus has an input coupled to said cell phone output, and an output coupled to said antenna;
   a power detector and control circuit that generates a control signal that is dependent upon the power level from said cell phone;
   said power detector and control circuit controls said amplifier apparatus to connect a selected at least one of a plurality of discrete attenuators in series with said amplifier to produce a gain that has a predetermined value that is dependent upon the output power from the cell phone, whereby continuously variable cell phone output power results in noncontinuous gain values for the amplifier.

8. A cell phone booster which is constructed to connect to a cell phone and to an antenna and which can boost a cell phone output signal that is generated by the cell phone for transmission by the antenna, wherein the booster includes a control that detects the strength of the cell phone output signal and that selects a level of amplification of the cell phone output signal that is delivered to the antenna, comprising:

an amplifier which has an input coupled to said cell phone output, and which has an amplifier output;

an attenuator apparatus which is connected in series with said amplifier and which is switchable between at least first and second discrete attenuation levels;

a switch arrangement controlled by said control which selects one of said attenuation levels of said attenuator apparatus in response to the strength of said cell phone output signal;

said amplifier output is of a strength to amplify the cell phone output by its maximum gain, and said control controls said attenuator apparatus to add zero attenuation when the cell phone output signal strength is above a minimum, so the output delivered to said antenna then is boosted by about the maximum amount over the output of said cell phone;

the second attenuation level is greater than zero dB attenuation, and said control connects said second attenuation level in series with said amplifier when the cell phone output signal strength is minimum, so the output delivered to said antenna device is then boosted by the minimum gain of the booster.

9. A cell phone booster which is constructed to connect to a cell phone and to an antenna and which can boost a cell phone output signal that is generated by the cell phone for transmission by the antenna, wherein the booster includes a control that detects the strength of the cell phone output signal and that selects a level of amplification of the cell phone output signal that is delivered to the antenna, comprising:

an amplifier which has an input coupled to said cell phone output, and which has an amplifier output;

an attenuator apparatus which is connected in series with said amplifier and which is switchable between at least first and second discrete attenuation levels;

a switch arrangement controlled by said control which selects one of said attenuation levels of said attenuator apparatus in response to the strength of said cell phone output signal;

said control includes a circuit portion that prevents the switching of said attenuator apparatus from one of said attenuation levels to a second of said attenuation levels until the strength of said cell phone output signal has changed to a lower signal level than the signal level at which the attenuator apparatus was last switched.

* * * * *